(12) United States Patent
West et al.

(10) Patent No.: US 11,963,328 B2
(45) Date of Patent: Apr. 16, 2024

(54) ELECTRONIC COMPONENT CONNECTOR COOLING DEVICE

(71) Applicant: Raytheon Company, Waltham, MA (US)

(72) Inventors: Don W. West, Coppell, TX (US); Evan Haynes, McKinney, TX (US)

(73) Assignee: Raytheon Company, Tewksbury, MA (US)

( * ) Notice: Subject to any disclaimer, the term of this patent is extended or adjusted under 35 U.S.C. 154(b) by 769 days.

(21) Appl. No.: 17/069,762

(22) Filed: Oct. 13, 2020

(65) Prior Publication Data

US 2022/0117108 A1 Apr. 14, 2022

(51) Int. Cl.
*H05K 7/20* (2006.01)
*H01R 13/622* (2006.01)

(52) U.S. Cl.
CPC ....... *H05K 7/20009* (2013.01); *H01R 13/622* (2013.01); *H05K 7/20145* (2013.01)

(58) Field of Classification Search
CPC .......... H05K 7/20009; H05K 7/20145; H05K 5/0247; H01R 13/622
See application file for complete search history.

(56) References Cited

U.S. PATENT DOCUMENTS 6,042,474 A 3/2000 Harvey et al.
6,384,325 B1 5/2002 Chastain et al.
(Continued)

FOREIGN PATENT DOCUMENTS

CN 111096091 A * 5/2020 .......... H05K 5/0213

OTHER PUBLICATIONS

Nambiar Koman Balakrishna; Horner Bryan Rene; Bailey Andrew Charles; Yuskevich Paul Andrew, "Electronics Cooling System", May 1, 2020, Johnson Controls Tech Co. LTD, Entire Document (Translation of CN 111096091) (Year: 2020).*

*Primary Examiner* — Stephen S Sul (57) ABSTRACT

An electronic component connector cooling device can include a base portion and a conduit portion extending from the base portion. The conduit portion can have a cooling channel. The electronic component connector cooling device can further include a housing coupling interface formed in the base portion and operable to facilitate coupling the electronic component connector cooling device to a housing that at least partially forms an enclosure about an electronic component. The electronic component connector cooling device can also include a connector coupling interface formed in the base portion and operable to facilitate coupling a connector to the electronic component connector cooling device. The connector can operably connect the electronic component to a component external to the enclosure. The electronic component connector cooling device can further include an inlet port formed in the conduit portion and in fluid communication with the cooling channel. The inlet port can be operable to couple to a cooling fluid source external to the enclosure and to receive a cooling fluid from the cooling fluid source. The electronic component connector cooling device can include one or more outlet ports formed in the base portion and in fluid communication with the cooling channel operable to direct the cooling fluid internal to the enclosure to cool the electronic component.

18 Claims, 4 Drawing Sheets

(56) References Cited

U.S. PATENT DOCUMENTS

| | | | |
|---|---|---|---|
| 7,254,957 B2 | 8/2007 | Weber et al. | |
| 8,824,147 B2 * | 9/2014 | Caron | H05K 7/20636 |
| | | | 174/547 |
| 11,076,508 B2 * | 7/2021 | Gao | H05K 7/20836 |
| 2014/0085817 A1 * | 3/2014 | Campbell | H05K 7/20772 |
| | | | 361/689 |
| 2014/0360498 A1 | 12/2014 | Alizoti et al. | |
| 2021/0378139 A1 * | 12/2021 | Rice | H01L 23/4735 |

* cited by examiner

ELECTRONIC COMPONENT CONNECTOR COOLING DEVICE

GOVERNMENT LICENSE RIGHTS

This invention was made with government support. The government has certain rights in the invention.

BACKGROUND

Some electronic devices (e.g., airborne sensors) are enclosed in sealed, protective cases that do not provide for ventilation and rely on air flow over the protective cases during operation in order to cool the electronic devices. However, in some operating scenarios (e.g., during ground operations or in laboratory settings), a supply of cooling air flow may be inadequate or nonexistent, which can lead to overheating of the electronic devices.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

In order to prevent or mitigate overheating issues that may arise during certain operating conditions (e.g., ground operations or in laboratory settings) for electronic devices (e.g., airborne sensors) contained within non-ventilated cases, fans and/or liquid cooling devices have been utilized to externally cool the cases in attempts to simulate the cooling effect of airflow over the cases that is achieved in normal operation. Such external fans and liquid cooling devices, however, may provide inadequate cooling and/or be cumbersome to incorporate (e.g., due to bulk, weight, complexity, etc.).

Accordingly, an electronic component connector cooling device is disclosed that can be incorporated into an existing electrical connector mounting on a case or housing for an electronic component, which can provide a ventilation port for injecting cooling fluid inside the case or housing in order to cool the electronic component. The electronic component connector cooling device can include a base portion. The electronic component connector cooling device can also include a conduit portion extending from the base portion. The conduit portion can have a cooling channel. The electronic component connector cooling device can further include a housing coupling interface formed in the base portion and operable to facilitate coupling the electronic component connector cooling device to, and supporting the electronic component connector cooling device about, a housing that at least partially forms an enclosure about an electronic component. The electronic component connector cooling device can also include a connector coupling interface formed in the base portion and operable to facilitate coupling a connector to, and supporting the connector about, the electronic component connector cooling device. The connector can operably connect the electronic component to an external component external to the enclosure. The electronic component connector cooling device can further include an inlet port formed in the conduit portion and in fluid communication with the cooling channel. The inlet port can be operable to couple to a cooling fluid source external to the enclosure and to receive a cooling fluid from the cooling fluid source. In addition, the electronic component connector cooling device can include one or more outlet ports formed in the base portion and in fluid communication with the cooling channel. The one or more outlet ports can be operable to direct the cooling fluid internal to the enclosure to cool the electronic component.

In one aspect, an electronic component cooling system is disclosed. The electronic component cooling system can comprise an electronic component. The electronic component cooling system can also comprise a housing at least partially forming an enclosure about the electronic component. The electronic component cooling system can further comprise an external component external to the enclosure. The electronic component cooling system can also comprise a connector operably connecting the electronic component to the external component. The electronic component cooling system can further comprise a cooling fluid source external to the enclosure and operable to supply a cooling fluid, Additionally, the electronic component cooling system can comprise an electronic component connector cooling device operably coupled to the housing, the connector, and the cooling fluid source. The electronic component connector cooling device can include a base portion. The electronic component connector cooling device can also include a conduit portion extending from the base portion. The conduit portion can have a cooling channel. The electronic component connector cooling device can further include a housing coupling interface formed in the base portion facilitating coupling the electronic component connector cooling device to, and supporting the electronic component connector cooling device about, the housing. The electronic component connector cooling device can still further include a connector coupling interface formed in the base portion facilitating coupling the connector to, and supporting the connector about, the electronic component connector cooling device. The electronic component connector cooling device can also include an inlet port formed in the conduit portion and in fluid communication with the cooling channel. The inlet port can be coupled to the cooling fluid source to receive the cooling fluid from the cooling fluid source. In addition, the electronic component connector cooling device can include one or more outlet ports formed in the base portion and in fluid communication with the cooling channel. The one or more outlet ports can be operable to direct the cooling fluid internal to the enclosure to cool the electronic component.

Figure 1:
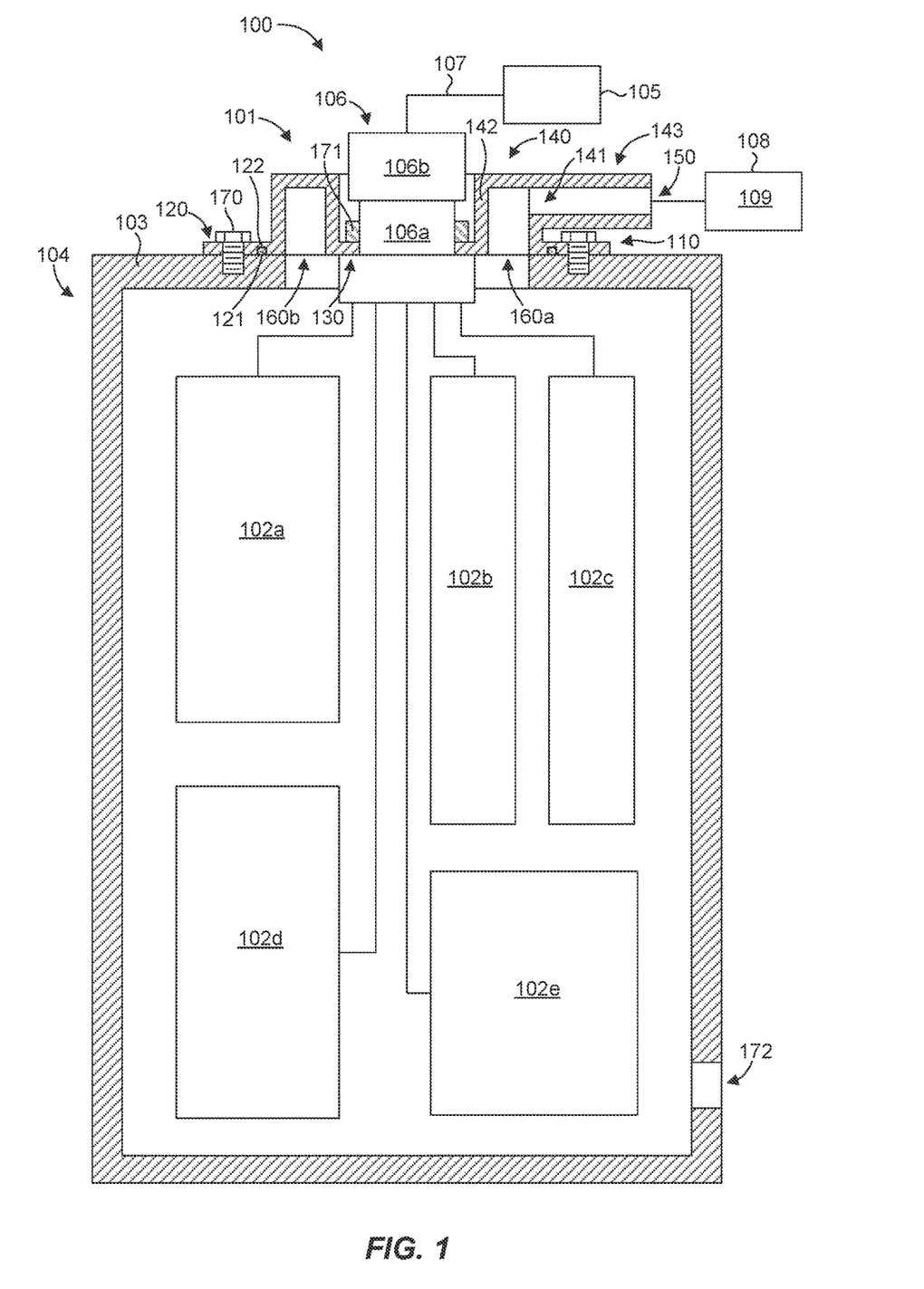
FIG. 1 is an illustration of an electronic component cooling system in accordance with an example of the present disclosure.
Figure 2:
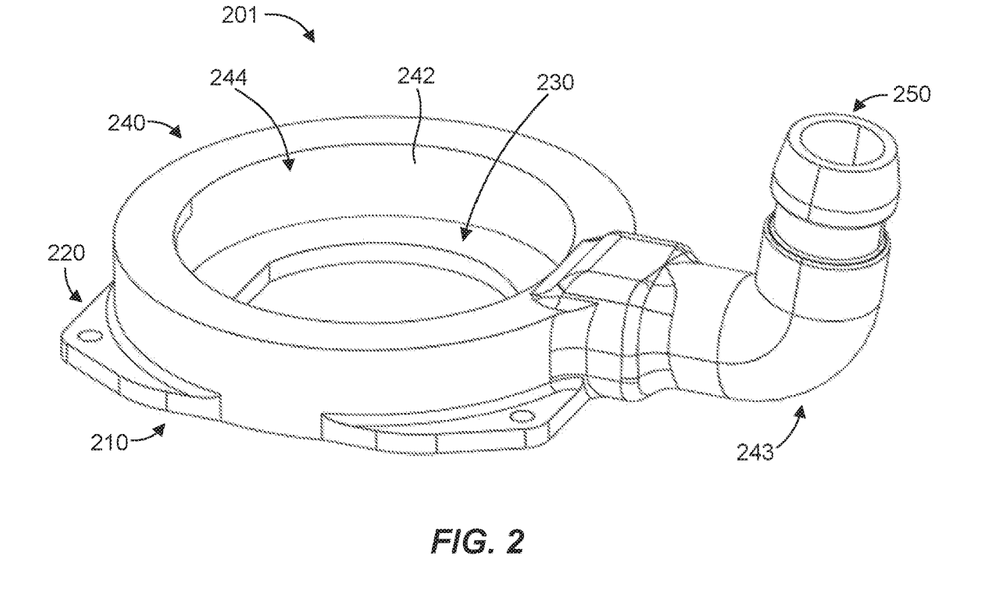
FIG. 2 is a top perspective view of an electronic component connector cooling device in accordance with an example of the present disclosure.
Figure 3:
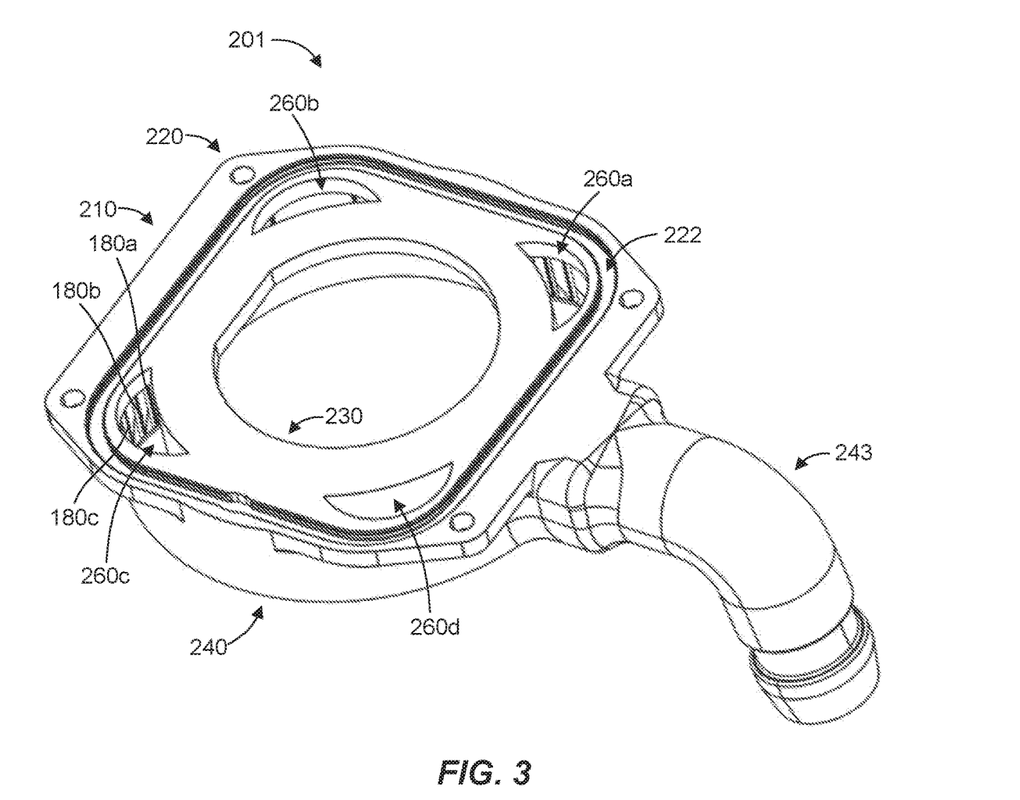
FIG. 3 is a bottom perspective view of the electronic component connector cooling device of FIG. 2.
Figure 4:
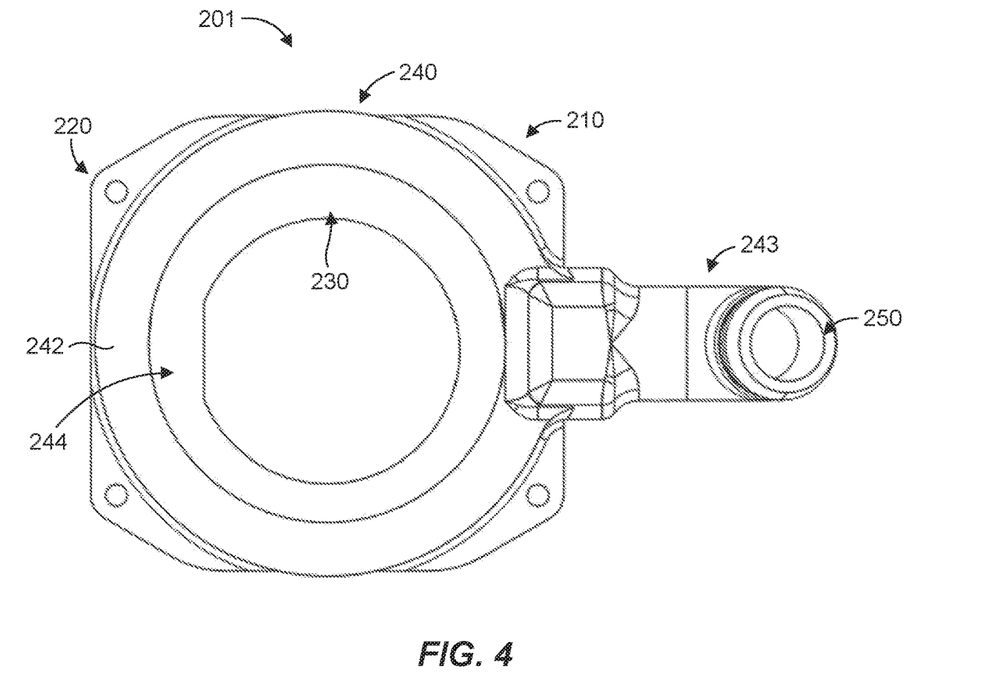
FIG. 4 is a top view of the electronic component connector cooling device of FIG. 2.
Figure 5:
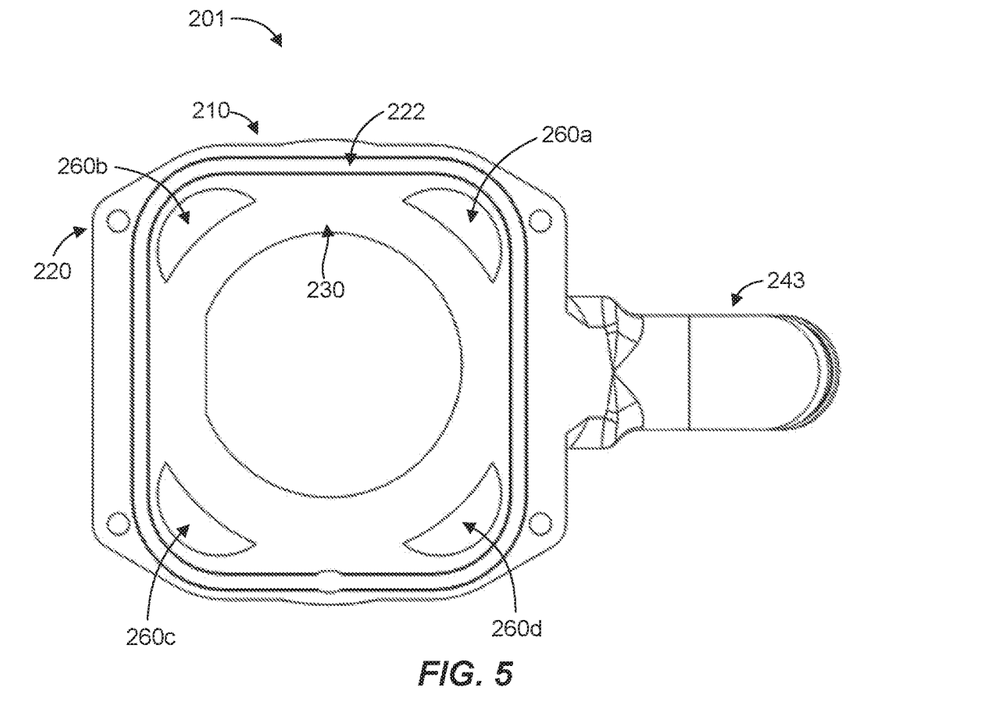
FIG. 5 is a bottom view of the electronic component connector cooling device of FIG. 2.

To further describe the present technology, examples are now provided with reference to the figures. With reference to FIG. 1, one example of an electronic component cooling system 100 is illustrated. The system 100 can include an electronic component connector cooling device 101, which is described in more detail below. In general, the system 100 can include one or more electronic components 102a-e, a housing 103 at least partially forming an enclosure 104 about the electronic components 102a-e, one or more external components 105 external to the enclosure 104, and a connector 106 operably connecting the electronic components 102a-e to the external component 105. In one aspect, the housing 103 can at least partially provide a sealed enclosure 104, such that the electronic components 102a-e are environmentally isolated from an external environment about the enclosure 104.

The electronic components 102a-e can be of any suitable type or configuration known in the art, such as computer parts and/or components (e.g., processors, memory, circuit boards, etc.), sensors (e.g., image sensors, position sensors, force sensors, radar, lidar, etc.), radios (e.g., hardware and/or software defined radios), actuators (e.g., DC motors, servo motors, stepper motors, solenoids, etc.), or any other type of electrical or electronic device. The housing 103 can be of any suitable type or configuration for housing, protecting, and/or providing functionality for one or more of the electronic components 102a-e. The housing 103 (e.g., a case) can be or include multiple individual parts or components, or the housing 103 can be a single unitary or monolithic component. In some examples, the housing 103 can include movable parts (e.g., a turret) that provides functionality for one or more of the electronic components 102a-e (e.g., a sensor). The one or more external components 105 can be or include any suitable device or component that may be in communication (e.g., power and/or data communication) with one or more of the electronic components 102a-e (e.g., a power supply, a control system, a network, etc.). The electronic components 102a-e and the one or more external components 105 can be operably coupled to one another in any suitable manner or technique known in the art, such as via a suitable cable 107 (e.g., a data cable, an optical cable, etc.), wire, etc. The connector 106 can be any suitable type of connector known in the art, such as an electrical connector (e.g., a data connector, a power connector, etc.), an optical connector, etc. The connector 106 can have any suitable configuration known in the art, such as a plug and socket connector, a pin connector, etc. In the example illustrated in FIG. 1, the connector 106 can include connector components 106a, 106b that are removably attachable or coupleable to one another.

As is typical with any electronic component, the electronic components 102a-e will generate heat during operation. In some examples of the system 100, such heat can be dissipated and removed via the housing 103 when the system is in its normal operating environment. For example, the housing 103 (e.g., a turret housing for orienting on-board sensors) can be mounted on an aircraft such that the housing 103 is exposed to external airflow about the aircraft, which can serve to remove heat from the housing 103 via external airflow over the housing 103 and thereby cool the electronic components 102a-e within the housing 103 during normal use and operation, Once such an external airflow over the housing 103 has ceased (e.g., once the aircraft has landed), various aspects of the present technology described below can serve to cool the electronic components 102a-e should they remain operational and should they still be generating heat.

In one aspect, the system 100 can include a cooling fluid source 10 external to the enclosure 104 and operable to supply a cooling fluid 109 to cool the electronic components 102a-e. As illustrated in FIG. 1, the connector cooling device 101 can be operably coupled to the housing 103, the connector 106, and the cooling fluid source 108. The connector cooling device 101 can provide for delivery of the cooling fluid 109 into the enclosure 104 via an access opening for the cable 107 (e.g., at the connector 106 interface or mounting location on the housing 103).

The connector cooling device 101 can comprise a base portion 110. In one aspect, the connector cooling device 101 can comprise a housing coupling interface 120 formed in the base portion 110. The housing coupling interface 120 can facilitate coupling the connector cooling device 101 to, and supporting the connector cooling device 101 about, the housing 103. The housing coupling interface 120 can include any suitable feature or geometry known in the art to facilitate coupling the connector cooling device 101 to the housing 103. In some examples, as shown in FIG. 1, the housing coupling interface 120 can comprise an outwardly extending flange. The electronic component connector cooling device 101 can be coupled to the housing 103 in any suitable manner known in the art, such as with one or more fasteners 170 securing the housing coupling interface 120 to the housing 103, In one example, the housing coupling interface 120 can include a seal 121 (e.g., an O-ring, a gasket, etc.), which may be disposed in a seal groove 122, to seal an interface between the connector cooling device 101 and the housing 103.

In another aspect, the connector cooling device 101 can comprise a connector coupling interface 130 formed in the base portion 110. The connector coupling interface 130 can facilitate coupling the connector 106 to, and supporting the connector 106 about, the connector cooling device 101. The connector coupling interface 130 can include any suitable feature or geometry known in the art to facilitate coupling the connector 106 to the connector cooling device 101. In some examples, as shown in FIG. 1, the connector coupling interface 130 can comprise an inwardly extending flange. The connector 106 can be configured to couple with and be supported by a support structure (e.g., the connector coupling interface 130) in any suitable manner known in the art. For example, in one aspect, the connector 106 can include a lock nut 171 threadable about the connector component 106a to couple the connector 106 to the connector coupling interface 130.

In one aspect, the connector cooling device 101 can comprise a conduit portion 140 extending from the base portion 110. The conduit portion 140 can include a cooling channel 141. In some examples, the conduit portion 140 can comprise a wall 142 that at least partially defines the cooling channel 141. In one aspect, the conduit portion 140 can be configured to be located laterally about the connector 106, as shown in FIG. 1. In a particular aspect, the conduit portion 140 can comprise an annular configuration. The connector cooling device 101 can also comprise an inlet port 150 formed in the conduit portion 140 and in fluid communication with the cooling channel 141. In some examples, the conduit portion 140 can comprise an inlet duct 143 that defines the inlet port 150. The inlet port 150 can be coupled to the cooling fluid source 108 to receive the cooling fluid 109 from the cooling fluid source 108. The connector cooling device 101 can further comprise one or more outlet ports 160a, 160b formed in the base portion 110 and in fluid communication with the cooling channel 141. The one or more outlet ports 160 can be operable to direct the cooling fluid 109 internal to the enclosure 104 to cool the electronic components 102a-e.

In one aspect, the enclosure 104 can include a vent port 172 (e.g., formed in the housing 103) operable to provide an outlet for the cooling fluid 109 from the enclosure 104. The vent port 172 can have any suitable configuration, such as a hole, an opening, a one-way valve, etc. In one example, the vent port 172 can comprise a threaded hole that can accommodate a plug (e.g., a bolt or screw) when venting from the vent port 172 is not needed (e.g., when the connector cooling device 101 is not in operation or not installed).

The cooling fluid 109 can be any suitable type of cooling fluid known in the art. In one aspect, the cooling fluid 109 can be a gas, a liquid, or both, and may or may not undergo a phase change during use. In one example, the cooling fluid 108 can be air. In this example, cold, clean, dry air can be injected into the enclosure 104, and the air volume can directly cool the electronic components by convection. During this process, the cold air can mix with warm air and the resulting mixed air exhaust can be released via the vent port 172 outside of the enclosure 104 volume. The amount of heat that can be removed is a function of fluid temperature and fluid flow rate. In one example, airflow of 9 CFM and an outlet air temperature 30 degrees higher than the inlet air temperature can provide a heat flow of approximately 150 Watts. Such additional cooling may prevent overheating and may also reduce cool-down time.

In one aspect, the electronic component connector cooling device 101 can be a temporarily installed device and/or a retrofit device. For example, the connector 106 may be originally mounted on the housing 103 via a mounting plate (not shown). The mounting plate can be removed and replaced by the electronic component connector cooling device 101, which can be designed to replicate or approximate the mounting plate's attachment interface with the housing 103 and the connector 106. The electronic component connector cooling device 101 can provide a ventilation port that installs under and around an existing electrical connector 106 mounted to the housing 103. The ventilation port can enable fresh air to be injected into the enclosure 104 (e.g., a housing or chassis) volume to exchange with hot air that can be exhausted from the enclosure 104 (e.g., through the vent port 172). Reusing an existing connector port location can allow retrofitting the electronic component connector cooling device 101 to an existing enclosure (e.g., a housing or chassis) design without permanent modification of the enclosure and connector hardware.

The various components or elements of the electronic component connector cooling device 101 can be manufactured using any suitable material (e.g., metal, plastic, composite, etc.) and any suitable technique or process (e.g., molding, forging, stamping, machining, welding, etc.). In some examples, the electronic component connector cooling device 101 can be manufactured utilizing additive manufacturing (e.g., 3D printing) techniques, which can enable the manufacture of complex geometry in a cost-effective single component part.

FIGS. 2-7 illustrate various views of an electronic component connector cooling device 201 in accordance with an example of the present disclosure. The electronic component connector cooling device 201 is similar to the electronic component connector cooling device 101 discussed above with reference to FIG. 1. Indeed, the disclosure concerning the electronic component connector cooling device 101 is applicable to the electronic component connector cooling device 201 unless otherwise specified, and therefore, much of the disclosure presented above will not be repeated here with specific reference to the electronic component connector cooling device 201.

In general, the electronic component connector cooling device 201 includes a base portion 210, a housing coupling interface 220 (e.g., an outwardly extending flange) formed in the base portion 210, a connector coupling interface 230 (e.g., an inwardly extending flange) formed in the base portion 210, a conduit portion 240 extending from the base portion 210, an inlet port 250 (FIGS. 2, 4, and 6) formed in the conduit portion 240, and one or more outlet ports 260a-d (FIGS. 3, 5, and 7) formed in the base portion 210. The housing coupling interface 220 can include a seal groove 222 (FIGS. 3, 5, and 6) to accommodate a seal (e.g., an O-ring) to seal an interface between the electronic component connector cooling device 201 and a housing.

Figure 6:
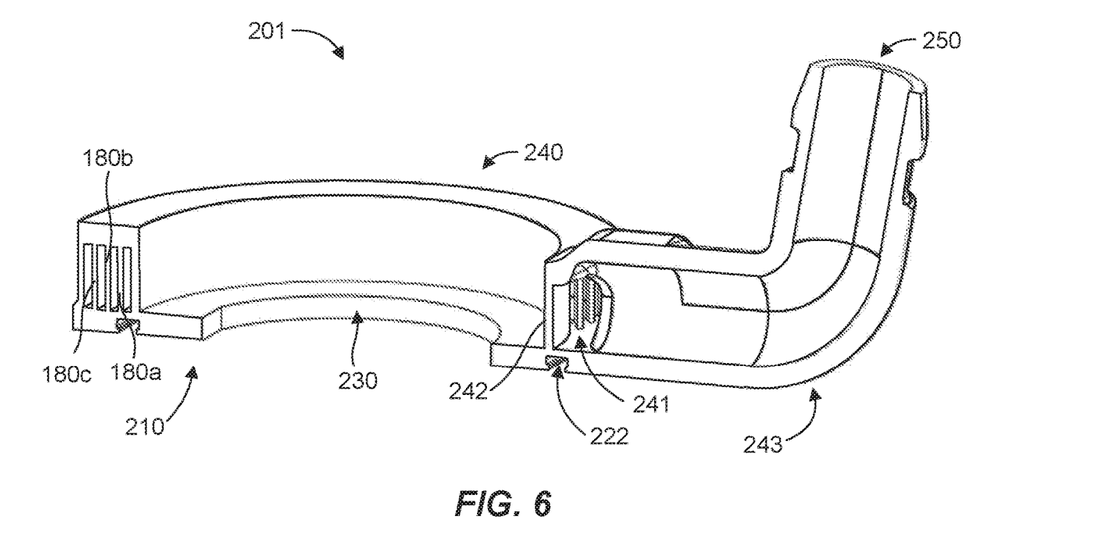
FIG. 6 is a side perspective cross-sectional view of the electronic component connector cooling device of FIG. 2.
Figure 7:
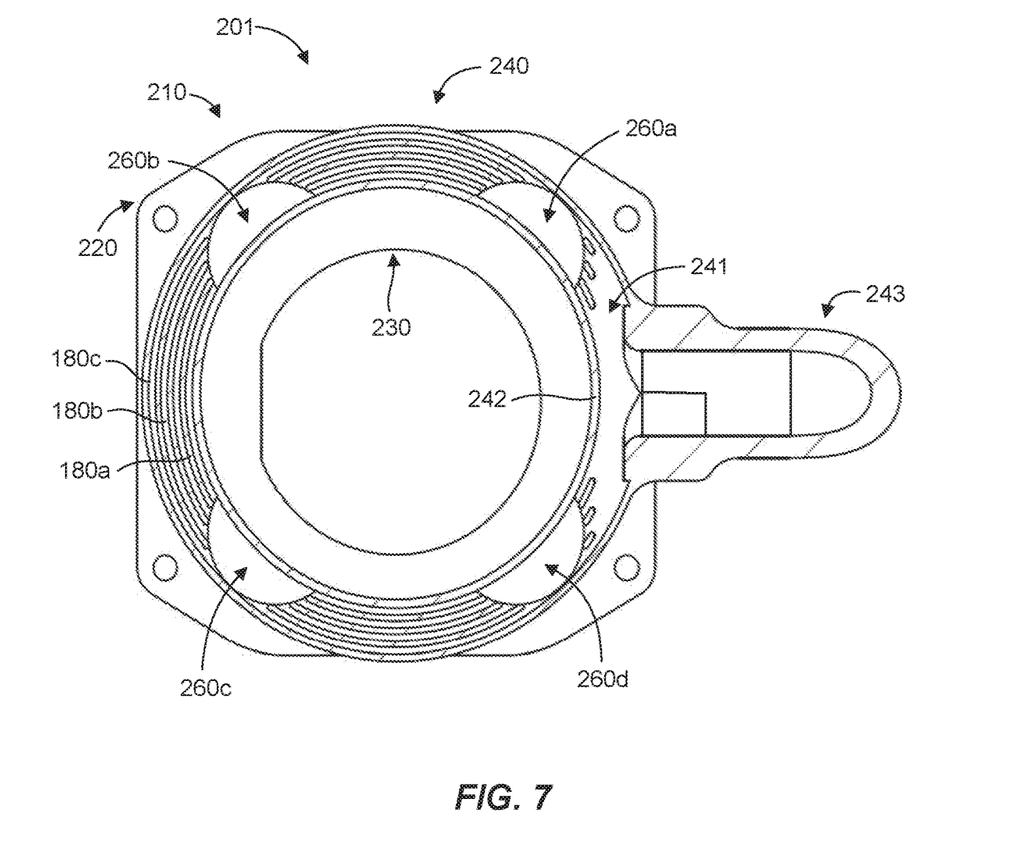
FIG. 7 is a top cross-sectional view of the electronic component connector cooling device of FIG. 2.

The conduit portion 240 can include a cooling channel 241 (FIGS. 6 and 7). The conduit portion 240 can comprise a wall that at least partially defines the cooling channel 241. The illustrated conduit portion 240 has an annular configuration that can locate the conduit portion 240 laterally about a connector (e.g., a connector can extend through an opening 244 (FIGS. 2 and 4) in the annular conduit portion 240). The conduit portion 240 can also comprise an inlet duct 243 that defines the inlet port 250. The inlet duct 243 can have any suitable configuration to facilitate access to or coupling with a cooling fluid source (e.g., with a hose). In the illustrated example, the inlet duct 243 extends laterally outward and then away from the base portion 210, which may provide space from an attached connector and housing for unhindered access to the inlet port 250.

In one aspect, the electronic component connector cooling device 201 can include one or more vanes 180a-c (FIGS. 3, 6, and 7) disposed in the cooling channel 241 to direct cooling fluid within the cooling channel 241 (e.g., to the various outlet ports 260a-d). Any number of vanes 180a-c having any suitable shape or configuration for directing fluid flow within the cooling channel 241 can be utilized. For example, as shown in FIG. 7, three vanes 180a-c can extend from top to bottom (e.g., proximate the base portion 210) and can have the same shape (e.g., circular) as the cooling channel 241. It should be recognized that any suitable number of outlet ports having any suitable size and/or shape can be utilized. For example, the outlet ports 260a-d have generally semi-circular shapes, but any shape or profile can be incorporated. In one aspect, a total area of the outlet ports 260a-d can be greater than or equal to an area of the inlet port 250 to ensure that the outlet ports 260a-d do not restrict fluid flow on a size basis.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An electronic component connector cooling device, comprising:
   a base portion;
   a conduit portion extending from the base portion, the conduit portion having a cooling channel, wherein the conduit portion comprises an annular configuration;
   a housing coupling interface formed in the base portion and operable to facilitate coupling the electronic component connector cooling device to, and supporting the electronic component connector cooling device about, a housing that at least partially forms an enclosure about an electronic component;
   a connector coupling interface formed in the base portion and operable to facilitate coupling a connector to, and supporting the connector about, the electronic component connector cooling device, the connector operably connecting the electronic component to an external component external to the enclosure, the connector extending through an opening in the annular conduit portion;
   an inlet port formed in the conduit portion and in fluid communication with the cooling channel, the inlet port being operable to couple to a cooling fluid source external to the enclosure and to receive a cooling fluid from the cooling fluid source; and
   one or more outlet ports formed in the base portion and in fluid communication with the cooling channel, wherein the one or more outlet ports is operable to direct the cooling fluid internal to the enclosure to cool the electronic component.

2. The electronic component connector cooling device of claim 1, wherein the conduit portion comprises a wall that at least partially defines the cooling channel.

3. The electronic component connector cooling device of claim 1, wherein the conduit portion is configured to be located laterally about the connector.

4. The electronic component connector cooling device of claim 1, wherein the conduit portion comprises an inlet duct that defines the inlet port.

5. The electronic component connector cooling device of claim 1, further comprising one or more vanes disposed in the cooling channel to direct the cooling fluid within the cooling channel.

6. The electronic component connector cooling device of claim 1, wherein the one or more outlet ports comprises a plurality of outlet ports.

7. The electronic component connector cooling device of claim 1, wherein the connector coupling interface comprises an inwardly extending flange.

8. The electronic component connector cooling device of claim 1, wherein the housing coupling interface comprises an outwardly extending flange.

9. The electronic component connector cooling device of claim 1, wherein the housing coupling interface comprises a seal disposed in a seal groove to seal an interface between the electronic component connector cooling device and the housing.

10. An electronic component cooling system, comprising:
    an electronic component;
    a housing at least partially forming an enclosure about the electronic component;
    an external component external to the enclosure;
    a connector operably connecting the electronic component to the external component;
    a cooling fluid source external to the enclosure and operable to supply a cooling fluid; and
    an electronic component connector cooling device operably coupled to the housing, the connector, and the cooling fluid source, the electronic component connector cooling device comprising:
    a base portion,
    a conduit portion extending from the base portion, the conduit portion having a cooling channel, wherein the conduit portion comprises an annular configuration, wherein the connector extends through an opening in the annular conduit portion,
    a housing coupling interface formed in the base portion facilitating coupling the electronic component connector cooling device to, and supporting the electronic component connector cooling device about, the housing,
    a connector coupling interface formed in the base portion facilitating coupling the connector to, and supporting the connector about, the electronic component connector cooling device,
    an inlet port formed in the conduit portion and in fluid communication with the cooling channel, the inlet port coupled to the cooling fluid source to receive the cooling fluid from the cooling fluid source, and
    one or more outlet ports formed in the base portion and in fluid communication with the cooling channel, wherein the one or more outlet ports is operable to direct the cooling fluid internal to the enclosure to cool the electronic component.

11. The system of claim 10, wherein the enclosure comprises a vent port operable to provide an outlet for the cooling fluid from the enclosure.

12. The system of claim 10, wherein the connector comprises a lock nut to couple the connector to the connector coupling interface.

13. The system of claim 10, wherein the electronic component connector cooling device is coupled to the housing with one or more fasteners securing the housing coupling interface to the housing.

14. The system of claim 10, wherein the cooling fluid is a gas.

15. An electronic component connector cooling device, comprising:
   a base portion;
   a conduit portion extending from the base portion, the conduit portion having a cooling channel comprising one or more vanes disposed to direct the cooling fluid within the cooling channel;
   a housing coupling interface formed in the base portion and operable to facilitate coupling the electronic component connector cooling device to, and supporting the electronic component connector cooling device about, a housing that at least partially forms an enclosure about an electronic component;
   a connector coupling interface formed in the base portion and operable to facilitate coupling a connector to, and supporting the connector about, the electronic component connector cooling device, the connector operably connecting the electronic component to an external component external to the enclosure;
   an inlet port formed in the conduit portion and in fluid communication with the cooling channel, the inlet port being operable to couple to a cooling fluid source external to the enclosure and to receive a cooling fluid from the cooling fluid source; and
   one or more outlet ports formed in the base portion and in fluid communication with the cooling channel, wherein the one or more outlet ports is operable to direct the cooling fluid internal to the enclosure to cool the electronic component.

16. An electronic component connector cooling device, comprising:
   a base portion;
   a conduit portion extending from the base portion, the conduit portion having a cooling channel;
   a housing coupling interface formed in the base portion and operable to facilitate coupling the electronic component connector cooling device to, and supporting the electronic component connector cooling device about, a housing that at least partially forms an enclosure about an electronic component, wherein the housing coupling interface comprises a seal disposed in a seal groove to seal an interface between the electronic component connector cooling device and the housing;
   a connector coupling interface formed in the base portion and operable to facilitate coupling a connector to, and supporting the connector about, the electronic component connector cooling device, the connector operably connecting the electronic component to an external component external to the enclosure;
   an inlet port formed in the conduit portion and in fluid communication with the cooling channel, the inlet port being operable to couple to a cooling fluid source external to the enclosure and to receive a cooling fluid from the cooling fluid source; and
   one or more outlet ports formed in the base portion and in fluid communication with the cooling channel, wherein the one or more outlet ports is operable to direct the cooling fluid internal to the enclosure to cool the electronic component.

17. An electronic component cooling system, comprising:
   an electronic component;
   a housing at least partially forming an enclosure about the electronic component;
   an external component external to the enclosure;
   a connector operably connecting the electronic component to the external component;
   a cooling fluid source external to the enclosure and operable to supply a cooling fluid; and
   an electronic component connector cooling device operably coupled to the housing, the connector, and the cooling fluid source, the electronic component connector cooling device comprising:
      a base portion,
      a conduit portion extending from the base portion, the conduit portion having a cooling channel;
      a housing coupling interface formed in the base portion facilitating coupling the electronic component connector cooling device to, and supporting the electronic component connector cooling device about, the housing;
      a connector coupling interface formed in the base portion facilitating coupling the connector to, and supporting the connector about, the electronic component connector cooling device, the connector comprising a lock nut to couple the connector to the connector coupling interface;
      an inlet port formed in the conduit portion and in fluid communication with the cooling channel, the inlet port coupled to the cooling fluid source to receive the cooling fluid from the cooling fluid source, and
      one or more outlet ports formed in the base portion and in fluid communication with the cooling channel, wherein the one or more outlet ports is operable to direct the cooling fluid internal to the enclosure to cool the electronic component.

18. An electronic component cooling system, comprising:
   an electronic component;
   a housing at least partially forming an enclosure about the electronic component;
   an external component external to the enclosure;
   a connector operably connecting the electronic component to the external component;
   a cooling fluid source external to the enclosure and operable to supply a cooling fluid in the form of a gas; and
   an electronic component connector cooling device operably coupled to the housing, the connector, and the cooling fluid source, the electronic component connector cooling device comprising:
      a base portion,
      a conduit portion extending from the base portion, the conduit portion having a cooling channel;
      a housing coupling interface formed in the base portion facilitating coupling the electronic component connector cooling device to, and supporting the electronic component connector cooling device about, the housing;
      a connector coupling interface formed in the base portion facilitating coupling the connector to, and supporting the connector about, the electronic component connector cooling device;
      an inlet port formed in the conduit portion and in fluid communication with the cooling channel, the inlet port coupled to the cooling fluid source to receive the gas from the cooling fluid source, and
      one or more outlet ports formed in the base portion and in fluid communication with the cooling channel, wherein the one or more outlet ports is operable to direct the gas internal to the enclosure to cool the electronic component.

\* \* \* \* \*